United States Patent
Gonzalez et al.

(10) Patent No.: US 8,117,381 B2
(45) Date of Patent: Feb. 14, 2012

(54) ADAPTIVE DETERMINISTIC GROUPING OF BLOCKS INTO MULTI-BLOCK UNITS

(75) Inventors: Carlos J. Gonzalez, Los Gatos, CA (US); Alan Douglas Bryce, Port Kennedy (AU); Sergey Anatolievich Gorobets, Edinburgh (GB); Alan David Bennett, Edinburgh (GB)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 13/084,396

(22) Filed: Apr. 11, 2011

(65) Prior Publication Data

US 2011/0191530 A1 Aug. 4, 2011

Related U.S. Application Data

(62) Division of application No. 12/512,282, filed on Jul. 30, 2009, now Pat. No. 7,970,985, which is a division of application No. 10/750,157, filed on Dec. 30, 2003, now abandoned.

(51) Int. Cl.
*G06F 12/00* (2006.01)
(52) U.S. Cl. ........ 711/103; 711/100; 711/102; 711/165; 711/200; 711/203; 711/209; 365/185.11; 365/230.03
(58) Field of Classification Search .................. 711/100, 711/102, 103, 165, 200, 203, 209; 365/185.11, 365/203.03
See application file for complete search history.

(56) References Cited

U.S. PATENT DOCUMENTS

| | | | |
|---|---|---|---|
| 5,428,621 A | 6/1995 | Mehrotra et al. | |
| 5,835,935 A | 11/1998 | Estakhri et al. | |
| 5,978,808 A | 11/1999 | Wells et al. | |
| 6,034,897 A * | 3/2000 | Estakhri et al. | 365/185.33 |
| 6,260,156 B1 | 7/2001 | Garvin et al. | |
| 6,360,293 B1 | 3/2002 | Unno | |
| 6,426,893 B1 | 7/2002 | Conley et al. | |
| 6,563,734 B2 | 5/2003 | Taki | |
| 6,574,705 B1 | 6/2003 | Peloquin et al. | |

(Continued)

FOREIGN PATENT DOCUMENTS

| | | |
|---|---|---|
| JP | 2003-015947 A | 1/2003 |
| JP | 2003-058417 A | 2/2003 |
| JP | 2004-265162 | 9/2004 |
| WO | WO 00/49488 | 8/2000 |

OTHER PUBLICATIONS

Chinese Office Action for Chinese Application No. 200480041681.0, dated May 19, 2009, 11 pages.

(Continued)

*Primary Examiner* — Tuan Thai
*Assistant Examiner* — Zhuo Li
(74) *Attorney, Agent, or Firm* — Davis Wright Tremaine LLP

(57) ABSTRACT

The present invention presents techniques for the linking of physical blocks of a non-volatile memory into composite logical structures or "metablocks". After determining an initial linking of good physical blocks into metablocks, a record of the linking is maintained in the non-volatile memory where it can be readily accessed when needed. In one set of embodiments, the initially linking is deterministically formed according to an algorithm and can be optimized according to the pattern of any bad blocks in the memory. As additional bad blocks arise, the linking is updated using by replacing the bad blocks in a linking with good blocks, preferably in the same sub-array of the memory as the block that they are replacing.

30 Claims, 11 Drawing Sheets

U.S. PATENT DOCUMENTS

| | | | |
|---|---|---|---|
| 6,581,132 B1* | 6/2003 | Kakinuma et al. | 711/103 |
| 6,742,078 B1* | 5/2004 | Chien et al. | 711/103 |
| 6,763,424 B2 | 7/2004 | Conley | |
| 6,763,480 B2 | 7/2004 | Harari et al. | |
| 6,901,498 B2 | 5/2005 | Conley | |
| 7,478,096 B2 | 1/2009 | Margolus et al. | |
| 2002/0049740 A1 | 4/2002 | Arning et al. | |
| 2002/0099904 A1* | 7/2002 | Conley | 711/103 |
| 2003/0065899 A1 | 4/2003 | Gorobets | |
| 2004/0177216 A1 | 9/2004 | Asari et al. | |
| 2006/0242212 A1 | 10/2006 | Brinkmann et al. | |

OTHER PUBLICATIONS

U.S. Office Action for U.S. Appl. No. 10/750,157 mailed Apr. 27, 2009, 21 pages.

Chinese Office Action for Chinese Application No. 200480041681.0, dated Feb. 12, 2010, 5 pages.

U.S. Office Action for U.S. Appl. No. 10/750,157 mailed Jan. 8, 2010, 22 pages.

Notification of Reasons for Refusal for Japanese Application No. 2006-547154 dated Aug. 3, 2010, 4 pages.

U.S. Office Action for U.S. Appl. No. 10/750,157 mailed Sep. 15, 2010, 22 pages.

Notification of Reasons for Refusal for Japanese Patent Application No. 2006-547154 dated Aug. 2, 2011, 5 pages.

Third Office Action for Chinese Application No. 200480041681.0 dated Aug. 10, 2011, 4 pages.

Fourth Office Action for Chinese Application No. 200480041681.0 dated Dec. 20, 2011, 10 pages.

* cited by examiner

ADAPTIVE DETERMINISTIC GROUPING OF BLOCKS INTO MULTI-BLOCK UNITS

CROSS-REFERENCE TO RELATED APPLICATION

This application is a divisional of U.S. patent application Ser. No. 12/512,282, filed Jul. 30, 2009, which is in turn a divisional of U.S. patent application Ser. No. 10/750,157, filed Dec. 30, 2003, both of which are herein incorporated in its entirety by this reference.

This application is related to U.S. patent application Ser. No. 10/750,155 entitled "NON-VOLATILE MEMORY AND METHOD WITH BLOCK MANAGEMENT SYSTEM," by Peter Smith, Alan Bennett, Alan Bryce, Sergey Gorobets, and Alan Sinclair, now U.S. Pat. No. 7,139,864, issued Nov. 21, 2006 and which is hereby incorporated by reference.

FIELD OF THE INVENTION

This invention relates generally to semiconductor nonvolatile data storage systems, and more specifically, to a system and method for forming physical blocks into larger logical structures that accommodate defects in non-volatile data storage systems.

BACKGROUND OF TIM INVENTION

Nonvolatile memory devices such as flash memories are commonly used as mass data storage subsystems. Such nonvolatile memory devices are typically packaged in an enclosed card that is removably connected with a host system, and can also be packaged as the non-removable embedded storage within a host system. In a typical implementation, the subsystem includes one or more flash devices and often a subsystem controller.

Current commercial memory card formats include that of the Personal Computer Memory Card International Association (PCMCIA), CompactFlash (CF), MultiMediaCard (MMC), Secure Digital (SD), MemoryStick, and MemoryStick-Pro. One supplier of these cards is SanDisk Corporation, assignee of this application. Host systems with which such cards are used include digital cameras, cellular phones, personal computers, notebook computers, hand held computing devices, audio reproducing devices, and the like.

The nonvolatile memory devices themselves are composed of one or more arrays of nonvolatile storage elements. Each storage element is capable of storing one or more bits of data. One important characteristic of the nonvolatile memory array is that it retains the data programmed therein, even when power is no longer applied to the memory array. In contrast, a volatile memory device requires that the power to the array be refreshed periodically in order to preserve the data contained in the volatile memory array. Another characteristic of non-volatile memory is that once a cell contained within a non-volatile memory array is programmed, that cell must be erased before it can be reprogrammed with a new data value.

The physical means for storing the charge in the memory cell can be implemented by using a floating gate transistor, such as an electrically erasable programmable read only memory (EEPROM). One known problem with floating gate devices such as EEPROMs is that the floating gate eventually wears out and breaks down after a very large number of write, program and erase cycles. When this happens, the cell is no longer usable and must be taken out of the list of available memory cells in the array. This sort of defect is called a "grown" defect. In one commercially available implementation, these defects are dealt with by mapping out the defective cells and substituting the physical addresses of good memory cells for the newly detected defective memory cells. Examples of implementations where defective cells or sectors are mapped out and replaced are described in U.S. Pat. No. 5,659,550 issued on Aug. 19, 1997 by Mebrotra et at; U.S. Pat. No. 5,671,229 issued on Sep. 23, 1997 by Baran et al.; and in U.S. Pat. No. 5,862,080 issued on Jan. 19, 1999 by Harari et al., which applications are expressly incorporated herein in their entirety by this reference.

Arrays of nonvolatile memory cells typically are partitioned into groups to provide for efficient implementation of read, program and erase functions. For example, in many nonvolatile memory architectures, the memory cells are arranged into a larger group called a unit of erase. This unit of erase is the smallest number of memory cells that are erasable at one time.

The size of the unit of erase depends on the memory architecture that is being implemented. In earlier nonvolatile memories, the unit of erase was a block that was the same size as a standard 512-byte disk drive sector. In one commercial form, each block contained enough cells to store one sector of user data plus some overhead data related to the user data and/or to the block in which it was stored. In order to ensure that the blocks of cells were individually erasable, the blocks had to be sufficiently isolated from one another.

Because this isolation took up valuable space on the integrated circuit chip, another memory architecture was developed in which the unit of erase was made significantly larger so there would be less space required for such isolation. An example of this large block system architecture is described in U.S. Pat. No. 6,580,638 issued on Jun. 17, 2003 by Conley et al., which is a continuation of U.S. Pat. No. 6,426,893 issued on Jul. 30, 2002. Both of these patents are expressly incorporated herein in their entirety by this reference. In a large block system, the unit of erase is often further partitioned into individually addressable pages that are the basic unit for reading and programming user data (unit of programming and/or reading). In one commercial implementation, the unit of erase is a metablock. A metablock is a virtual unit of erase that is composed of multiple physical units of erase. These multiple physical units of erase can be used in parallel program and erase operations, but are addressed as a single logical block.

One method of forming metablocks, or "super" blocks is described in U.S. Pat. No. 6,034,897, which is expressly incorporated herein in its entirety by this reference. As described therein, for a memory having a number of devices, the same physical block in each of the devices is grouped into a metablock. Although this allows for the formation of metablocks and all of the blocks in a given metablock to be addressed by the same address, namely the address of the block in the first of the devices, it has a number of limitations. For example, as the linking of blocks into metablocks is pre-determined in this fixed configuration, when a block goes bad, the metablock to which it belongs becomes bad despite the other blocks within it still being functional. Thus, it is desirable goal to provide a system and method for an adaptable metablock arrangement without the operational overhead of establishing a new linking every time one is needed.

SUMMARY OF THE INVENTION

The various aspects of the present invention overcome these and other limitations found in the prior art for the linking of physical memory structures into composite logical structures. In the primary embodiment of the present invention, techniques are presented for the formation of metablock structure in flash memories. According to a first aspect of the present invention, the linking of block into metablocks is updated to accommodate defective portions of the memory. A system for maintaining a defect map includes a defect map structure for tracking the existence of factory and grown defects in a nonvolatile memory system that is organized into metablocks. A method for maintaining a defect map makes use of the defect map structure and the characteristics of a metablock. In one embodiment, the size of the defect map structure is equal to the parallelism of the nonvolatile memory system. In another embodiment, the remaining units of erase that cannot be assigned to a metablock will be kept in a list of spare units of erase for later use.

According to another aspect of the present invention, a record of the linking of blocks into metablocks is maintained in the non-volatile memory. The controller can then read out the linking into its volatile memory as needed. The record is updated in response to re-linkings resulting from defects. A complete linking record may be maintained in the non-volatile memory, for example in a specified location, or only a partial linking record may be maintained. In another aspect of the present invention, an initial linking of blocks into metablocks is deterministically formed by an algorithm using, for example, a firmware based implementation. In this case, the linking record stored in the non-volatile memory need only contain the deviations from the standard algorithm.

Additional aspects, features and advantages of the present invention are included in the following description of exemplary embodiments, which description should be read in conjunction with the accompanying drawings.

DESCRIPTION OF EXEMPLARY EMBODIMENTS OF THE INVENTION

Generally, the memory system of the present invention maintains in its main non-volatile memory a record of the linking of blocks into multi-block metablock structures. This record contains a defect map of factory and gown defects in a map table that can be read into non-volatile memory on demand. This map is updated as grown defects are encountered and blocks are assigned to new locations. Metablocks are preferable formed by one block in each of several subarrays, or planes, and in this case, the grouping is done preferably with same-numbered blocks in each plane, with the exception of blocks that are marked bad and placed in the map. In one embodiment, the blocks are directly mapped to alternate blocks. Metablocks that would contain the defective block are then reformed with the alternate block in the corresponding plane. Rather than maintain a complete record of the linking of blocks into metablocks within the non-volatile memory, a "standard" linking can be based on an algorithm implanted, for example, in the system's firmware, with only the deviations due to defects from this algorithm needing to be stored. Those standard metablocks with no defects present will be termed usable standard metablocks. The remaining Metablocks are termed unusable standard metablocks, and the component physical blocks will be termed spare blocks.

Figure 1:
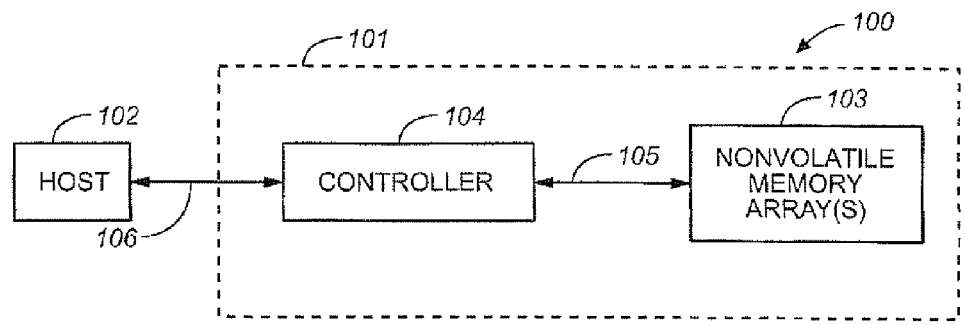
FIG. 1 is a block diagram of an existing nonvolatile memory system in which the nonvolatile memory array and the memory controller are packaged in an enclosed card that is removably connected with a host system.
Figure 2:
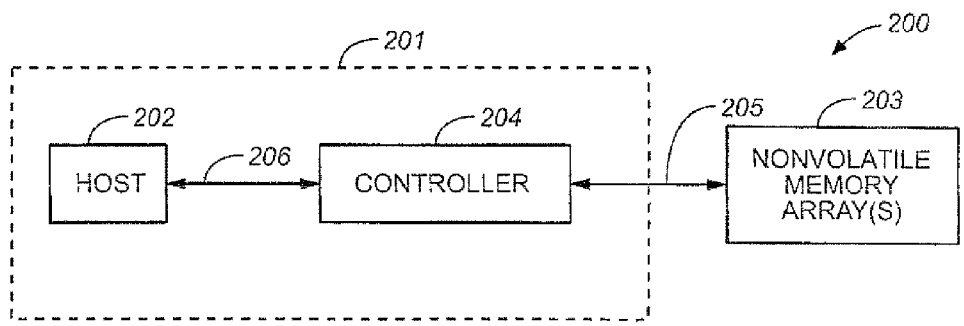
FIG. 2 is a block diagram of an existing nonvolatile memory system in which the nonvolatile memory array is packaged in an enclosed card that is removably connected with a host system.
Figure 3:
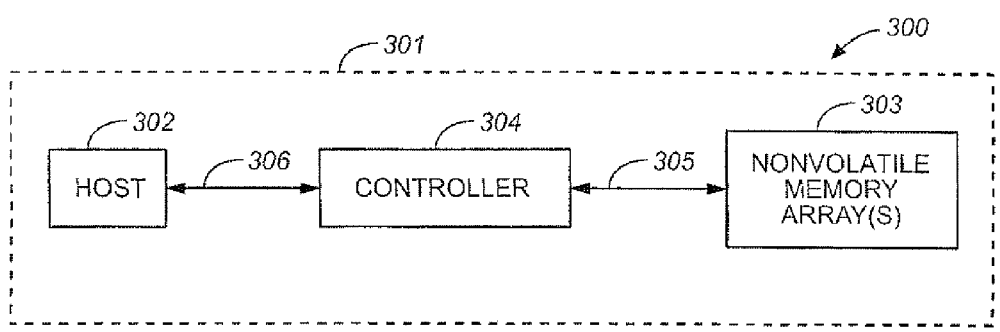
FIG. 3 is a block diagram of an existing nonvolatile memory system in which the nonvolatile memory array is packaged as non-removable embedded storage within a host system.

FIG. 1-3 are block diagrams of typical existing nonvolatile memory systems which include a host 102, 202, 302, a controller 104, 204, 304 and a nonvolatile memory array or plurality of arrays 103, 203, 303. In FIG. 1, the nonvolatile memory array 103 and the memory controller 104 are shown as being packaged in an enclosed card that is removably connected with a host system 102. In FIG. 2, controller 204 is shown as being part of the host system 202 and the nonvolatile memory array 203 is shown as being packaged in an enclosed card that is removably connected with a host system. In FIG. 3, the nonvolatile memory array 303 is shown as being packaged as non-removable embedded storage within a host system 302.

Typically, the nonvolatile memory array includes memory cells that include one or more conductive floating gates as storage elements. The memory arrays could include other long-term electron charge storage elements instead, for example a charge trapping dielectric. A variety of nonvolatile storage elements can be used, including nonvolatile multi-state storage elements, storage elements that are Flash/EEPROM/floating gate, nonvolatile storage elements such as NROM, MNOS, MRAM/FRAM, NAND, NOR, and non-volatile storage elements that are organized into units of erasure. Non-volatile storage elements that store digital information, analog information or combinations of both can be used.

The memory cell array can be operated with two levels of charge defined for each storage element to therefore store one bit of data with each element. Alternatively, more than two storage states can be defined for each storage element, in which case more than one bit of data is stored in each storage element.

Figure 4A:
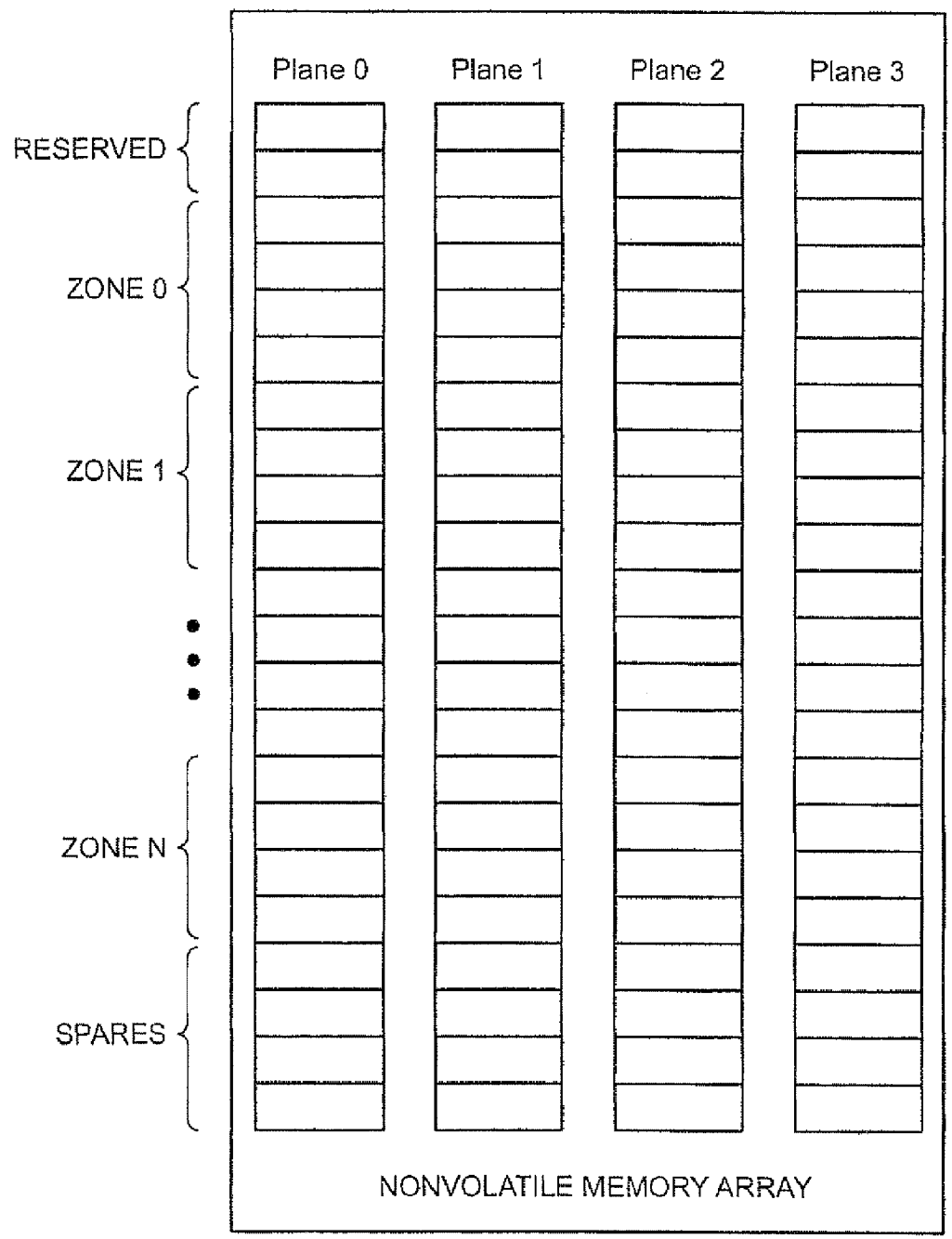
FIG. 4a illustrates an example chip format showing planes, zones and spares.

FIG. 4a illustrates an example of how a memory chip can be formatted into groups of units of erase (or blocks), where the blocks are arranged according to physical planes and logical zones. Some reasons for dividing the chip this way include equalizing the number of good units of erase within each group, and setting aside special purpose sections of the memory chip. For example, a special "reserved" section can be set aside to store information such as system and device parameters, and information about zone alignment. A section can also be set aside to store spare units of erase, also known as spares, or spare blocks. Information that is relevant to the spares, for example, their physical addresses, can be kept in a spares list for retrieval when needed. For example, when a defect is detected in one of the units of erase contained in one of the N zones, a spare can be found by remapping the defective unit of erase to one of the spare units of erase that are available.

Data from the host is typically just provided to the memory system identified as logical sectors. For example, the host will send data described in terms of a starting logical sector and the total number of sectors. Within the host, these logical sectors may be structured into larger units, but this information is typically not passed on to the memory's controller. (Knowledge of these host structures can be used, though, to have physical structures in the memory or controller constructs that reflect these host structures as they will reflect how the host transfers data: for example, memories are typically structured to store user data based on a physical sector that is the same size as a logical sector.) The controller organizes the host structures into logical constructs that mimic the physical structure for more efficient storage of them in the physical memory. For example, in a common arrangement the memory system controller groups logical sectors (as defined by the host) into logical blocks that correspond in size to the physical structure of a block, which is the physical unit of erase for a flash type memory. The controller can then maintain the relation of the physical structures to the logical constructs, for instance in the form of a Sector Address Table (SAT), and update this correspondence as the logical to physical relation changes.

For greater efficiency, memory systems often increase parallelism by introducing larger structures. For instance, in a memory system having a number of semi-autonomous arrays that can be written, read, or both, concurrently, blocks from different arrays are grouped into "metablock" structures and the controller will form logical blocks of data into corresponding logical metablocks, allowing for the multiple blocks to be operated upon at the same time. A metablock can be formed from planes with a single memory chip or one or more planes distributed across several memory chips. In this way, by allowing a group of (logically) sequential sectors spans over multiple physical blocks that can be read/programmed/erased in parallel, then this group can be read/programmed/erased concurrently with a minimal number of non-concurrent read, program, or erase operations. This arrangement is beneficial for sequential read and writes of logically contiguous sectors of relatively large amounts of data.

The structure of FIGS. 5-10 will be discussed first and then the operations shown by each figure will be explained individually. FIGS. 5-10 show an arrangement of six blocks in four planes, for a total of 24 units of erase, as an example of the memory array of FIGS. 1-3. For convenience, the units of erase will be referred to as blocks since a block is a kind of unit of erase. The size of this 6×4 block structure is chosen for convenience of explanation, as will become apparent below. A typical memory array would contain many more blocks (have many more rows) than are shown here, and could have more planes than shown if the parallelism of the nonvolatile memory system is greater than four.

Each plane typically has its own data registers and programming circuits. This allows for simultaneous programming into the blocks of memory cells of each of the planes. Each plane is operable semi-independently of the other planes. For convenience of illustration, the planes depicted in FIGS. 5-10 are shown to have 6 physical blocks 0-5. The actual number of blocks in any given configuration can be lower but is typically much higher.

In systems where there are a large number of blocks, the planes can be logically divided into zones as shown in FIG. 4a. The zones extend across the plurality of planes. Dividing the planes into zones is done to divide a plane into smaller more manageable segments. The blocks in each plane within a zone can occupy the same contiguous set of physical block addresses. The number of zones is not specifically limited, although practical design decisions can affect the number of zones implemented in a particular memory system. The various aspects of the present invention may be implemented in a memory with or without the zone structure, and, for memories that do have a zone structure, within the planes as a whole or with the individual zones.

The unit of operation used by the memory system as applied to the scenarios in FIGS. 5-10 is preferably a metablock. A metablock represents a virtual linking of a plurality of physical blocks across planes. Optional uses of a metablock include pipelined erasure of all the blocks within the metablock, and pipelined programming and reading of one or more pages from each block of the metablock.

Figure 5:
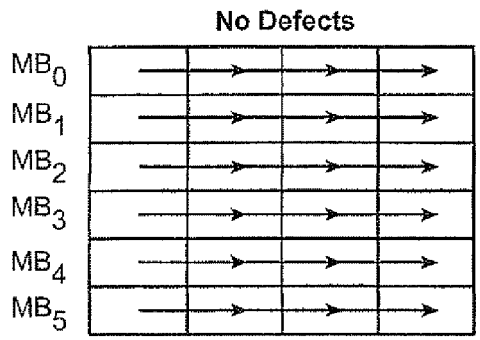
FIGS. 5-10 illustrate how the system can respond to a series of grown defects occurring on a portion of a memory array.
Figure 8:
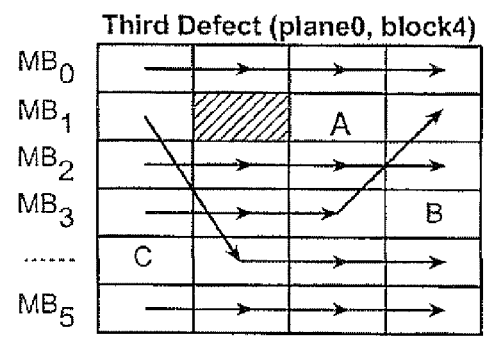
Figure 9:
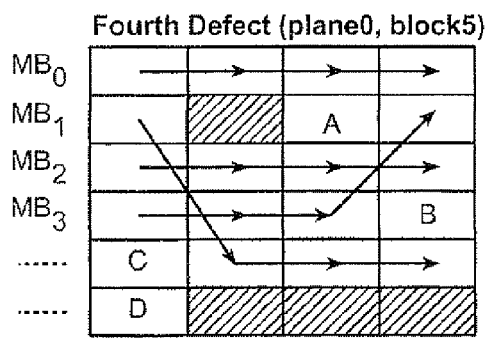
Figure 10:
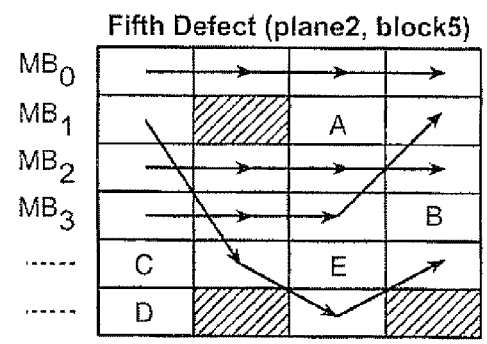

A metablock extends across multiple planes and typically includes one block from each of these planes, as shown by the arrows in each of the sets of connected arrows shown in FIGS. 5-10. FIG. 5 shows the simplest form of metablock, where each physical block of every metablock has the same block offset and extends across all four planes 0-3. FIG. 10 illustrates two more complicated metablocks. The creation of these metablocks will be discussed in the description of FIGS. 5-10, where the component blocks contained in a metablock are updated as defects are encountered.

Figure 4B:
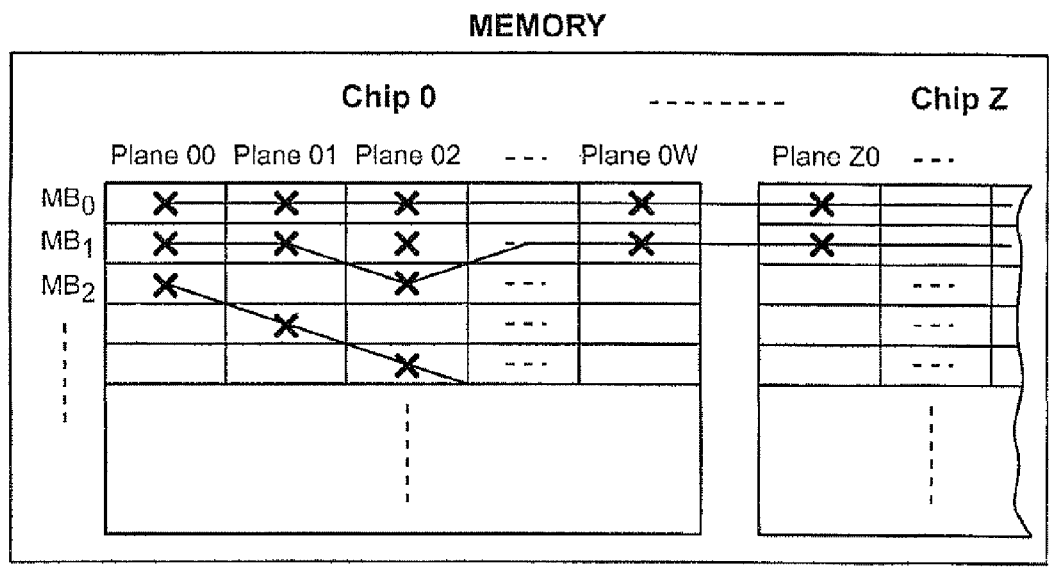
FIGS. 4b-d illustrate various linkings of physical blocks into metablocks.
Figure 4C:
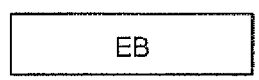
Figure 4D:
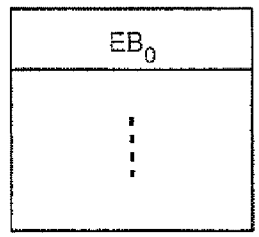

The more general situation for the linking of blocks into metablocks is shown in FIG. 4b. The memory portion of the system (103, 203, 303 of FIGS. 1-3 respectively) is taken to consist of chips 0-Z, with each chip having a number of planes, such as planes 00 to 0W for chip 0. Each linked physical unit in a plane, indicated by an x, can consist of a single physical block, as shown in FIG. 4c, or multiple physical blocks, as shown in FIG. 4d. The sort of two-dimensional meta-blocks shown in FIG. 4d that link blocks not only across planes and chips, but also in depth, can be convenient especially when physical blocks are small. However, convenience may not be the only or even the main reason for the arrangement of FIG. 4d. In the usual, or one-dimensional, linking a primary motivation is to provide a mechanism for handling data that can be written to multiple blocks in different chips/planes concurrently. Similarly, if the memory design allows parallel access (read and program) of more than one location in a plane in parallel, then it may make sense also to link multiple blocks within the same plane.

Several metablock linkings are shown, where each metablock MB is numbered according to the first row of the first block in the linking; for example, the metablock starting with block 0 is labeled $MB_0$, and so on. Although FIG. 4b shows each plane having a block (and only one block) in a given linking and the linking running across several planes, neither of this situations need always be the case. For example, a linking of, say, four blocks as in FIGS. 5-10 could consist of four planes on a single chip or one plane from four planes.

As shown in FIG. 4b, the linking $MB_0$ has all of its blocks from the same row, $MB_1$ has most of its blocks from the same row, and $MB_2$ has each block from the row below the preceding block. The discussion of FIGS. 5-10 will take the case MB$_0$, with all blocks from the same row, for ease of discussion, with the more general case discussed below. These various linking methods may either be fixed or, according to an aspect of the present invention discussed more below, determined based upon an algorithm. (Alternately, the initial determination may be based on a random allocation.) In a more general context, it will be appreciated that the various aspects of the present invention can be applied generally when physical structures are formed in larger logical conglomerates and be applied to how these conglomerates are managed.

The first metablock as shown in FIG. 10 includes block 0 in each of the four planes 0-3. The second metablock includes block 1 in plane 0, block 4 in plane 1, block 5 in plane 3, and block 4 in plane 3. The third metablock includes block 2 in each of the four planes 0-3. The fourth metablock includes block 3 in plane 0, block 3 in plane 1, block 3 in plane 2 and block 1 in plane 3.

Alternatively, a metablock could include only a subset of the number of planes contained within a single zone. This example is not shown but can be useful if variable degrees of parallelism are desired. A system having variable degrees of parallelism could allow for blocks to move between areas having different parallelism. For example, a metablock that contained two blocks instead of four could move from an area where the parallelism is two (two planes) to an area where the parallelism is four (as in our four-plane example). If two metablocks each containing two members exist in such a system, they could be combined into one four-member metablock. One caveat to using such a mixed-parallelism system is that the defect map would have to be reconciled to account for the varying parallelism.

In general, using metablocks increases the parallelism of the memory system by allowing for more blocks to be processed at one time in parallel. This increased parallelism significantly increases the performance of the memory system. The memory system maintains the identity of the individual blocks within the various metablocks. For example, the identity of the individual blocks within the various metablocks can be maintained as a linked list in any convenient location within the system.

Usually, overhead data stored along with user data of each page will include an address, logical and/or physical, sufficient to identify the plane, zone and block in which the pages reside, as well as an offset of the page within that block. An address map is then created within a memory of the controller by the controller reading these address fields of the page overhead data. This is usually done for part of the memory at a time, preceding a programming, reading or erasing operation directed to that part of the memory.

FIGS. 5-10 show how the system responds to the detection of defects in the physical blocks of the memory array. These defects can be factory or grown defects. This series of figures are intended to show what occurs each time a new defect is encountered. For purposes of illustration, the physical blocks that are numbered 1-5 contain defects.

The first figure, FIG. 5 shows a portion of a memory array in which no defects exist. A plurality of metablocks is depicted by six horizontal arrows extending across all of the four planes. Each metablock comprises a defined number of physical blocks. In FIGS. 5-10 the defined number of physical blocks is four for all of the metablocks, which corresponds to the number of planes.

FIG. 5 shows a portion of a memory array in which no factory or grown defects have been found. The black arrows extending horizontally across the diagram depict six linear standard metablocks. A linear standard metablock is a metablock that comprises physical blocks with matching offsets, as shown in FIG. 5. The initial linkings may either be established according to an algorithm, as described further below, or formed from a erase pool of available good blocks.

In one embodiment of the invention, a feature of the metablock is that the first virtual block address (associated with the first physical block address) is the only information required to determine the locations of the remaining physical blocks associated with that particular metablock, the rest of the linked metablocks being determined by a linking algorithm. This reduces the size of the data required for storing the metablocks. If a defect is encountered in the first physical block, then the entire metablock becomes invalid and gets mapped out of the address space because there is no longer any mechanism for pointing to the remaining members of the metablock located across each of the available planes or planes. An example of this will be shown in the discussion of FIG. 9 below.

Figure 6:
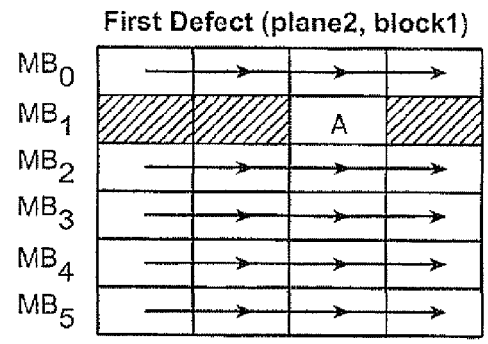

FIG. 6 shows the state of the array after a first new defect is encountered. The new defect is located in MB$_1$ at the physical block labeled "A", located at block 1 on plane 2. When a physical block within a metablock fails, the metablock can no longer be used as is. One simple solution would be to map that metablock out of the address space and never use it again. This is the only solution available if the system only has one single bad physical block and no spare blocks are available. However, if multiple bad physical blocks appear, this solution quickly becomes wasteful because the remaining physical blocks associated with the failed metablock can be used to create other good metablocks. As a result of the defect found in FIG. 6 (labeled "A"), the remaining three good physical blocks (shown by hatch marks) become spares.

Figure 7:
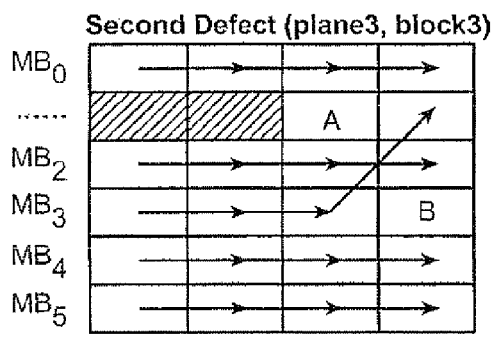

FIG. 7 shows the state of the array after a second new defect is encountered. The new defect is at the physical block labeled "B", located in MB$_3$ at block 3 on plane 3. In a method for maintaining a defect map such as the one shown in FIG. 11, the plane where the defect occurred (plane 3) will be searched for any available spare blocks. Here, physical block 1 is available (and shown by hatch marks in FIG. 6) in plane 3. Since block 1 is available in plane 3, the metablock will be updated to point to block 1 in order to replace the defective part of the metablock; that is, the defective block in MB$_3$ at plane 3 ("B") is replaced in the linking by the good block at plane 3 in MB$_1$ that was made redundant due to the failure of the block "A" at plane 2 of MB$_1$. When a physical block failure is encountered, a spare physical block is linked into the metablock to take the place of the failed physical block.

(Under the naming convention being used, there is no metablock MB$_1$ at the point of FIGS. 6 and 7 since the whole metablock is named based upon the block number in plane 0. The name MB$_1$ is retired unless the block 1 at plane 0 is returned in a new linking, as occurs in FIG. 8.)

FIG. 8 shows the state of the array after a third new defect is encountered. The new defect is located at the physical block labeled "C", located at block 4 on plane 0. This metablock cannot be re-linked because the defective block is located on plane 0. The block located on plane 0 is the block that contains the reference information to the rest of the members of the metablock, and without the block on plane 0, there is no way to reference the metablock under the adopted convention. Therefore, even though a spare block is available at block 1 on plane 0, it cannot be used to complete this metablock. Instead, block 1 on plane 0 is re-mapped into the virtual address space and used as the first block in a new metablock to take advantage of the now redundant blocks in planes 1, 2, and 3 of the former metablock MB$_4$. Thus, defective block "A" can be replaced by block 4 of plane 2. As block 1 of plane 3 has been remapped FIG. 7, it will also need to be replaced. Consequently, a re-linked $MB_1$ can be formed using the spares at block 4 from planes 2 and 3. For plane 1, a block is available in both block 1 and block 4. Although either can be chosen to complete the re-linked $MB_1$, the block formerly in $MB_4$ is used in the example. Consequently, the re-linked $MB_1$ comprises block 1 on plane 0, block 4 on plane 1, block 4 on plane 2 and block 4 on plane 3. At this point, only one spare block remains at block 1 on plane 1.

FIG. 9 shows the state of the array after a fourth new defect is encountered. The new defect is located at the physical block labeled "D", located at block 5 on plane 0. Since there are no spare blocks located in plane 0 at this point, this metablock cannot be re-linked. As a result, the remaining physical blocks are added to the spare physical block pool. This includes block 5 on plane 1, block 5 on plane 2 and block 5 on plane 3. At this point, four spare blocks are available in the memory array shown.

FIG. 10 shows the state of the array after a fifth new defect is encountered. The new defect is located at the physical block labeled "E", located at block 4 on plane 2. Since a spare block is available on the same plane (block 5 on plane 2), the metablock $MB_1$ is re-linked using that spare block.

Note that in FIG. 10, although four of the six original metablocks, corresponding to rows 1, 3, 4, and 5, have bad blocks, re-linking has resulted four good metablocks. Under a fixed linking, such as is described in U.S. Pat. No. 6,034,897 described in the Background section, these defects would have resulted in the loss of four of the six shown meta-blocks. In this manner, a greater data capacity is maintained by the memory as it ages and defects arise.

Figure 11:
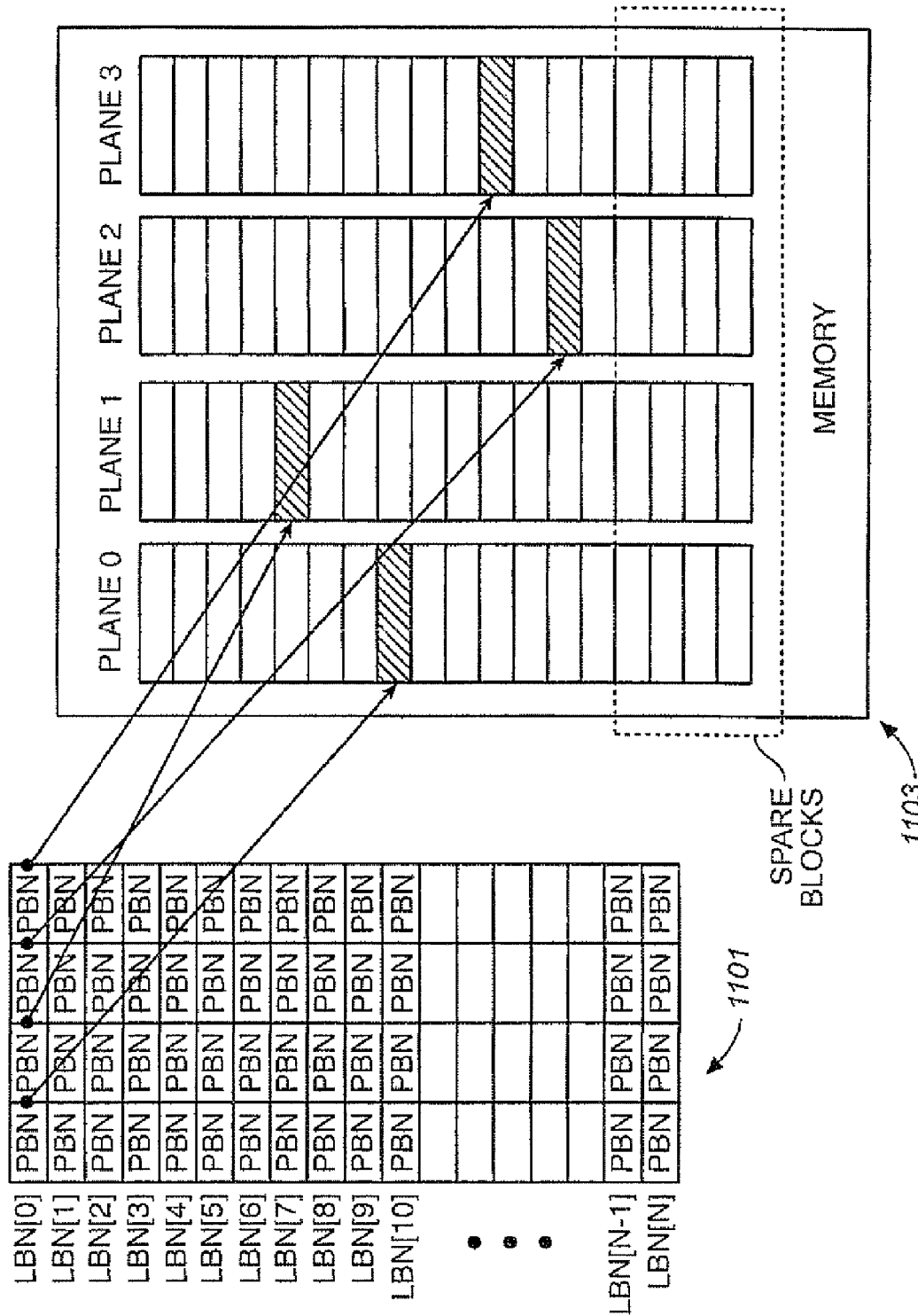
FIG. 11 illustrates an example of the mapping of the virtual structure elements of a metablock in response to the detection of a grown defect on a unit of erase.

FIG. 11 illustrates how the component members of a metablock can be mapped using a logical-to-physical mapping table 1101. A metablock in memory 1103 (or memory zone in an embodiment using that structure) associated with LBN[0] is shown by the blocks marked by hash marks. The (in this example) four planes of the memory may again be distributed across more than one chip. The PBN entries contained within LBN[0] refer to the physical addresses of each of the blocks marked by hash marks and which are parts of the metablock. The first member of the metablock, contained in plane 0, is used to access the other metablock members. As described with respect of FIGS. 5-10, if the metablock member in plane 0 is found to be defective, then the entire metablock must be marked as defective because they are linked to the rest of the metablock via the member on plane 0.

The mapping table 1101 is one example of a record of the linking of blocks to form metablocks. One technique that allows for adaptability of the metablock composition is, whenever a metablock is needed for a write process, to dynamically form a metablock from a pool of available good blocks. Although this technique allows for adaptability for the metablock structure, it then requires that the linking be re-established whenever a block is needed; further, it requires that each plane be accessed in order to determine this pool. According to one of the primary aspects of the present invention, this record is stored at a location in the non-volatile memory. This record can then be read from the flash memory into volatile memory (or an alternate non-volatile memory) on the controller on demand for use in address translation.

In one set of embodiments, the record of the linking information can be maintained in a special non-volatile memory location, such as somewhere outside the normal physical blocks where user data is stored. For instance, this record can be maintained in one of the reserved areas in plane 0 of FIG. 4a, or in any of the system zones in an arrangement such as is described in U.S. patent application publication US2003/0065899, which is hereby incorporated by reference. In another set of embodiments, the linking information can be kept in the header area of the user data sectors/control data sectors for written, or partially written, blocks. For blocks in the erased state, the linking information can be stored in a special control data area in non-volatile memory.

By use of such a table, the linking of blocks into metablocks can be updated to accommodate defects and, by keeping a record in the non-volatile memory, it is readily accessible when needed, thereby overcoming the limitation of the prior art discussed in the Background.

Figure 12:
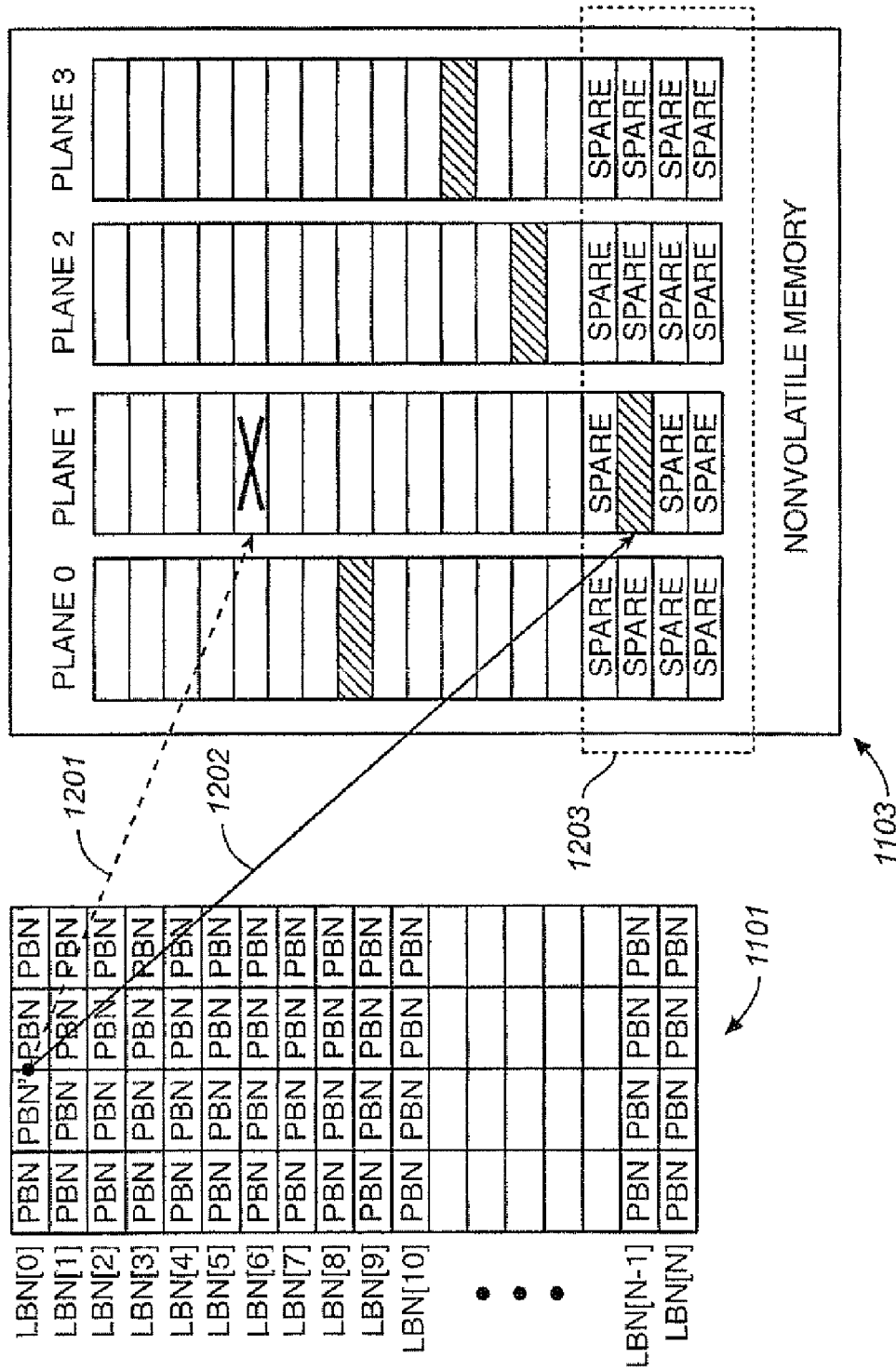
FIG. 12 illustrates an example of a system for maintaining a defect map, wherein a spare unit of erase is not available in the same plane as a unit of erase having a grown defect.

The defect map aspect of the present invention is illustrated in FIG. 12, which shows a bad block at on plane 1. The bad block is marked with an "X." Before the block was found to be defective, the second member of the metablock LBN[0] pointed to that block, as shown by dotted line arrow 1201. The collection of spare blocks 1203 has a spare available on the same plane that is shown by the hatch marks. (Alternately, if a spare was available in plane 1 from another linking that had developed an error, as in the process of FIGS. 5-10, it could be used instead of a block from the collection of spares 1203.) The physical block number (PBN) of the spare PBN' will replace the PBN of the block that failed. As a result, this spare becomes part of the metablock, as shown by arrow 1202.

Figure 13:
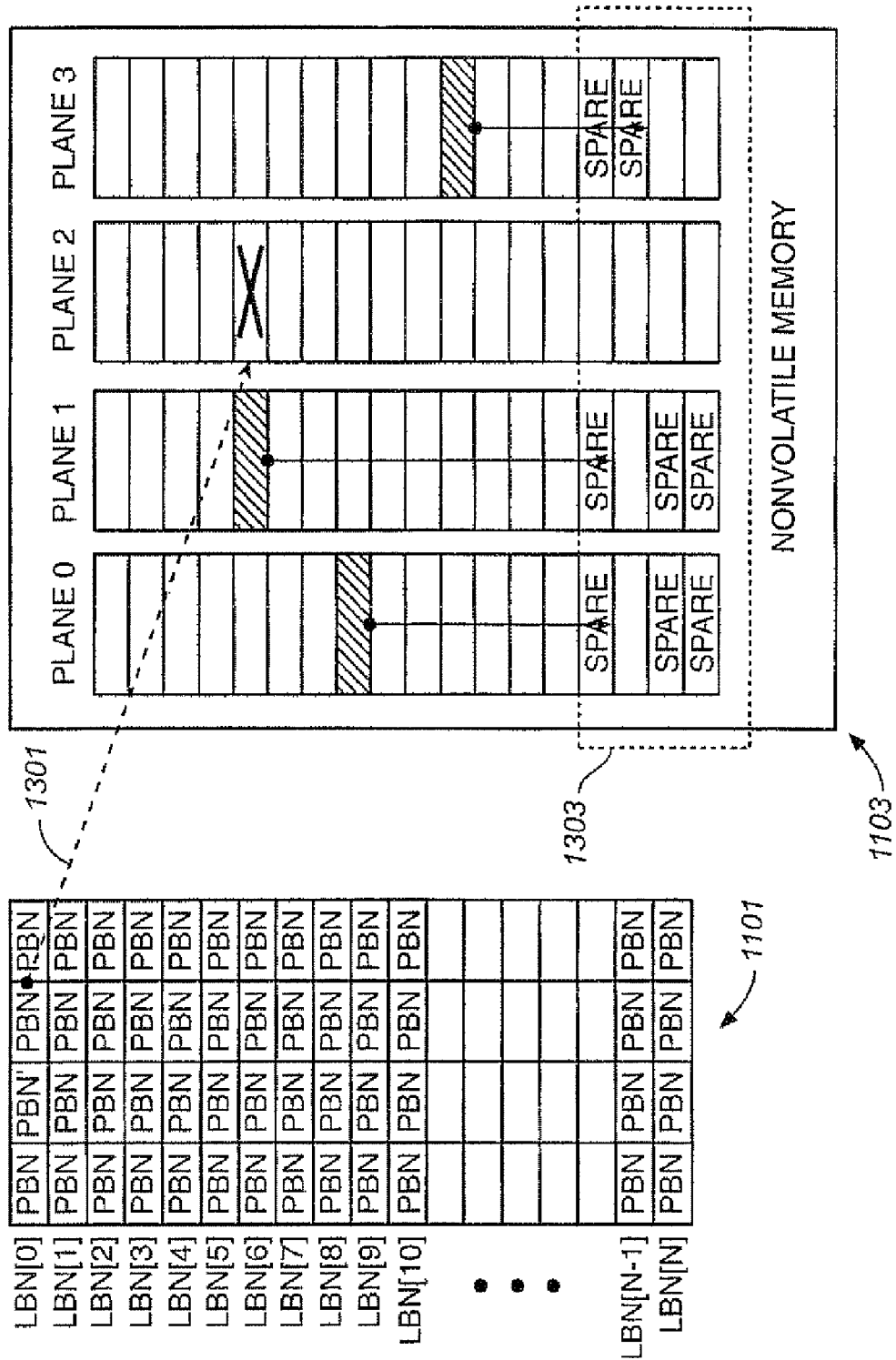
FIG. 13 illustrates an example of a method for maintaining a defect map.

FIG. 13 illustrates an example of a map structure similar to the map structure in FIG. 11. The map structure in FIG. 13 shows a bad block, possibly a grown defect, as shown on the block marked by an "X" on plane 2. A spare is not available on the same plane as the bad block, as shown by the fact that the collection of spare blocks in erase pool 1302 on plane 2 has no spares. Therefore, instead of redirecting the bad block on plane 2 to point to a spare, the physical blocks associated with the rest of the metablock (the blocks on planes 0, 1 and 3) are added to the spares pool, as shown by the three downward pointing arrows.

Figure 14:
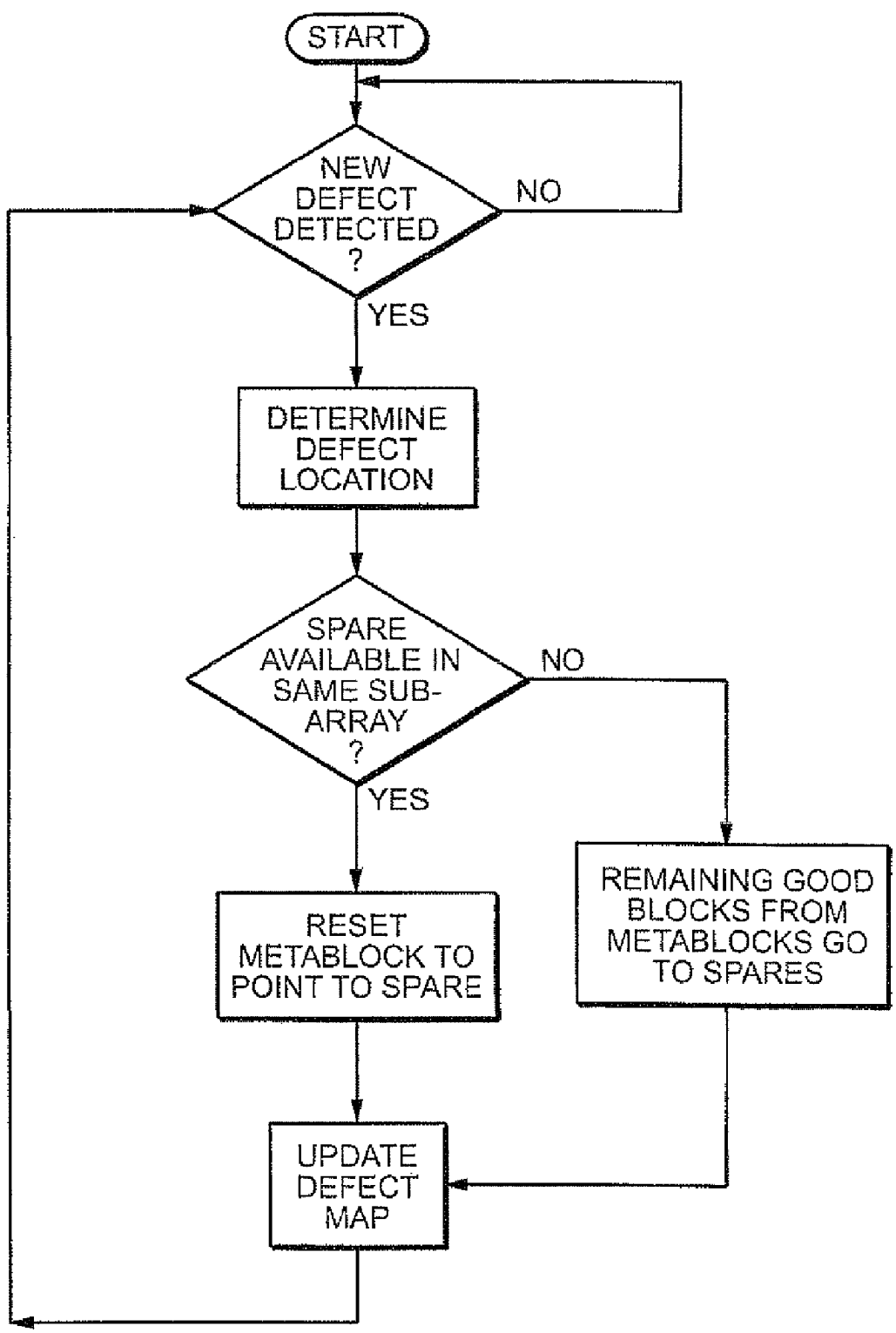
FIG. 14 illustrates an example of a method for maintaining a defect map using the data structure of FIGS. 11-13.

FIG. 14 illustrates an example of a method for maintaining a defect map using the data structure of FIGS. 11-13. If a defect is detected or encountered, the location of that defect is determined by looking up the physical location or physical block number (PBN). If a spare block is available in the same plane as the physical location of the defective block, then the metablock associated with the defect is pointed to the spare in order to replace the defective block, after which the defect map is updated. This scenario is shown in FIG. 12. Otherwise, if there are no remaining spare blocks in the same plane as the defective block, then the remaining good blocks from the metablock are directed to the spares pool. This scenario is shown in FIG. 13.

As noted above, one of the principle aspects of the present invention is that the controller maintains a record of the linking table in the non-volatile memory. This record may be a complete listing of the blocks forming each metablock corresponding to a given physical address, such as logical-to-physical mapping table 1101 of FIGS. 11-13. Alternately, a standard linking of physical blocks into metablocks may be based upon a deterministic algorithm, and the record maintained in the non-volatile memory need only contain any deviations from the linking rule. As a linking is updated due to defects and consequently deviates from a standard linking, the record is correspondingly updated.

The described mechanisms employed for linking physical blocks into metablocks are designed to maximize the number of metablocks for any distribution of bad physical blocks, and to allow new metablocks to be created when physical blocks fail during the life of the system. As above, metablock number is defined from the address of the physical block in the first plane incorporated in the metablock.

A "standard" metablock comprises physical blocks whose physical block addresses are a deterministic function of the metablock number. For example, this could be the arrangement of metablock $MB_0$ in FIG. 4b, which is also used for the example of FIGS. 5-10, where all of the blocks of a standard metablock are in the same row. This arrangement can be represented as $MB_1=(i,i,i,i)$, where the $n^{th}$ entry in the parentheses represent the row to which the block in the $n^{th}$ plane belongs.

Figure 15:
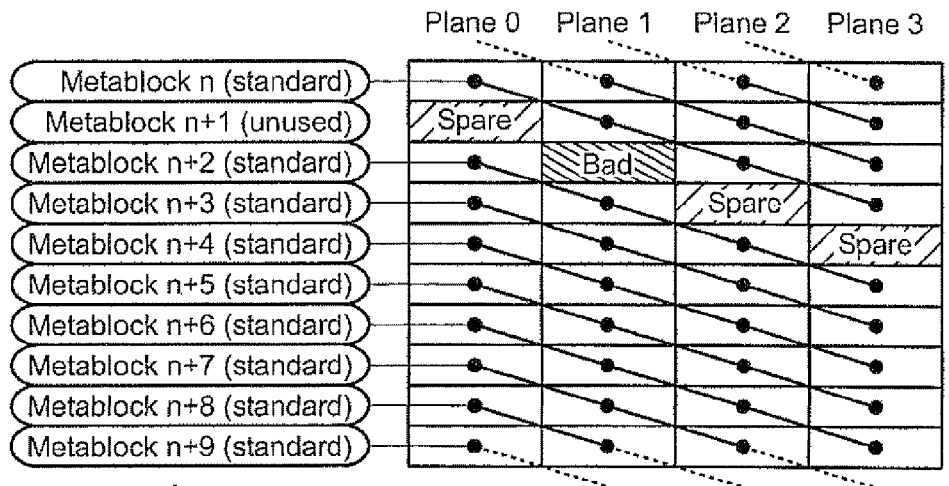
FIGS. 15-18 illustrate an algorithmically based linking of physical blocks.

In another example, as in the arrangement of metablock $MB_2$ in FIG. 4b, the physical block address is given by the metablock number plus an offset equal to the sequential number of the plane to which the physical block belongs; that is metablock i is composed of the blocks i+(plane number). For a metablock of four blocks, this can be represented, $MB_i=(i, i+1, i+2, i+3)$. This structure is shown in FIG. 15 and will be used to discuss the algorithmically based linking table. More generally, the algorithm based, deterministic linking can be described as $$MB_i=(i,f_1(i,\text{plane number}),f_2(i,\text{plane number}),f_3(i,\text{plane number}))$$

for the case of a four block metablock, with the extension for other numbers following in the obvious manner. In the expression, i is the row number and $f_1$, $f_2$, and $f_3$ are some functions of the row and plane number. As the convention that the metablock number is the same as the row number of plane 0, the first entry in $MB_i$ is i. For the examples of FIGS. 5-10, $f_1=f_2=f_3=i$, while for FIG. 15, $f_1=f_2=f_3=i+$(plane number). The discussion of the re-linking process for the algorithmic based linking will largely go through an abbreviated version of process of FIGS. 5-10, but based on the standard linking of FIG. 15. The controller can use a firmware-based implementation for determining the standard linking.

The physical blocks are linked into metablocks according to rules that maximize the possible number of standard metablocks. When a metablock is being linked, a standard block is created if the required physical blocks are available. If any physical block required for formation of, a standard metablock is bad, the metablock number is classified as unused. If any physical block required for formation of a standard metablock is bad, the metablock number is classified as unused. In this case, other usable physical blocks which are consequently left unlinked are classified as spare, as shown for metablock n+1 in FIG. 15.

Another aspect of the present invention is the optimization of the standard linking pattern based on the pattern of defects on the card or to otherwise maximize the number of usable standard metablocks. When a card is being formatted (or re-formatted), the pattern of bad blocks can be scanned and the decision about the 'standard' linking pattern can be made so that they match each other as much as possible. In many cases, the matching of the algorithm for the standard linking to the bad block pattern will reduce the needed re-linked metablock and meta- to physical address translation overhead, thereby optimizing (at least initially) the linking. An example of this is shown in FIGS. 16 and 17.

Figure 16:
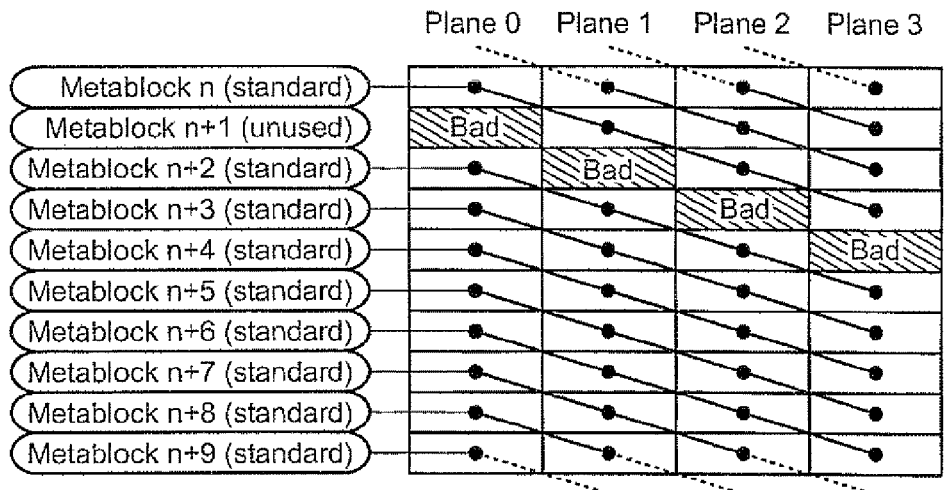
Figure 17:
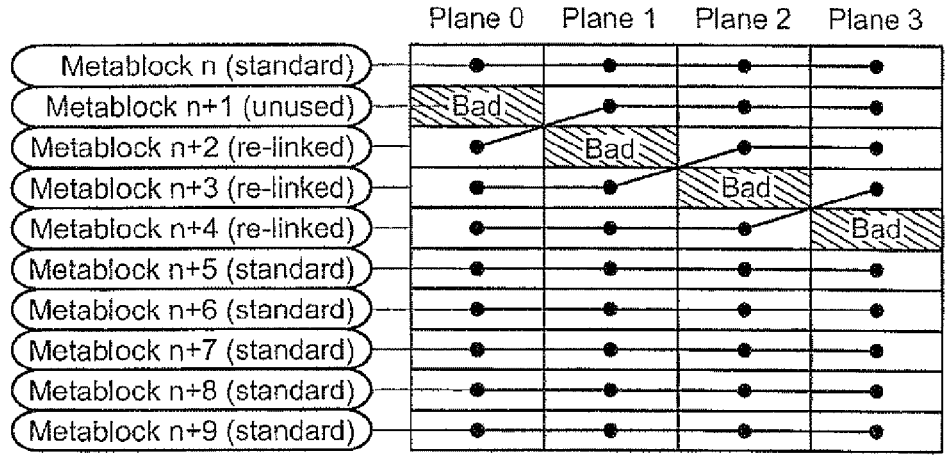
Figure 18:
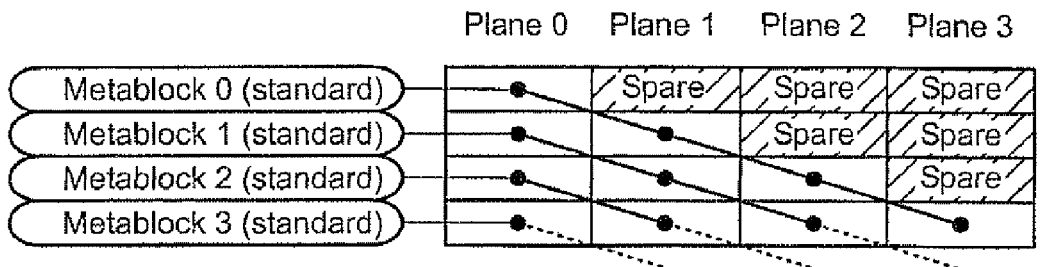

FIGS. 16 and 17 consider an example where four bad physical blocks, one from each of planes 0-3, run diagonally. In the case of a diagonal pattern of bad blocks, the best pattern for standard blocks will also be diagonal, as shown in FIG. 16. As a result, in this example, there will be no re-linked blocks at all and, consequently, none of the metablocks require translation through a linking table and the number of usable metablocks is increased. FIG. 17 is shows the equivalent situation when the standard linking is straight across, rather than matching the bad block pattern. In the example where the standard method is straight across, three metablocks (n+2, n+3, and n+4) need to be re-linked.

The standard block pattern can be unique for every card, for every re-formatting, or both. This can provide an extra level of data security, where every card has a unique method of data scrambling across different blocks. Consequently, standard metablocks need not necessarily have the same configuration, although they will have been formed using the same rule. In another embodiment, the host may want to provide the rule and code for the metablock linking rule, so that the algorithm is not system specific.

Figure 19:
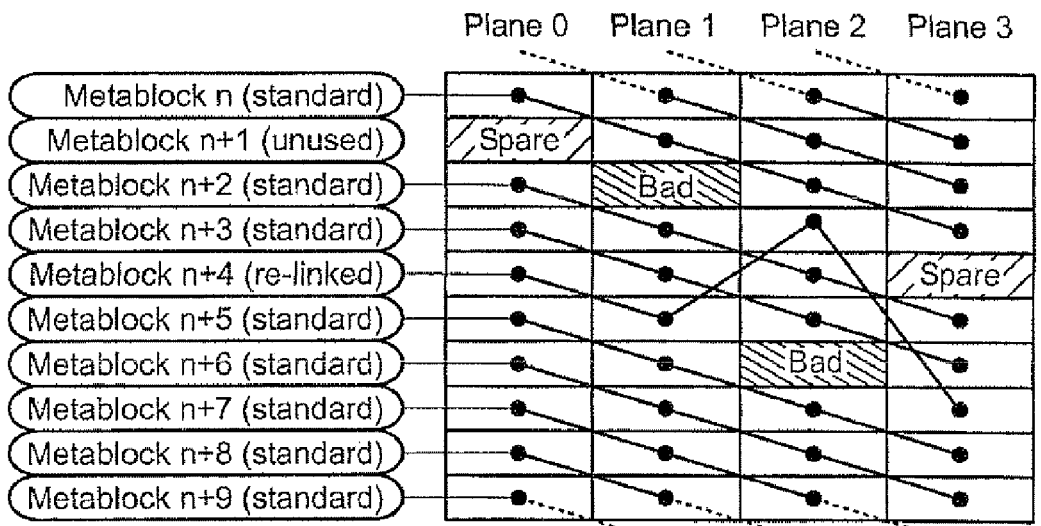
FIGS. 19, 20 and 22 illustrate the re-linking of physical blocks.
Figure 20:
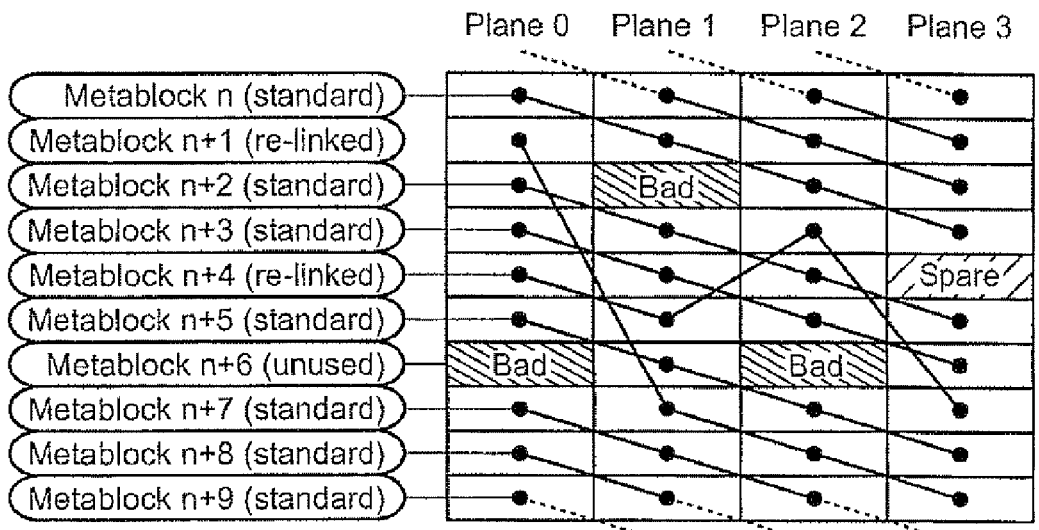

When metablocks are being linked during an initial formatting process, some physical blocks near the beginning of block address space, or near chip or die boundaries, cannot be linked into standard metablocks, as shown in FIG. 20. These physical blocks are classified as spare. Spare physical blocks are recorded in a spare physical block list, and may subsequently be used in the formation of re-linked metablocks, as described in FIG. 19.

Metablocks which cannot exist as standard blocks may be structured as re-linked metablocks. Re-linked metablocks may be formed during the initial formatting process of the memory system, or in response to failure of a physical block within an existing metablock. Metablock n+4 in FIG. 19 cannot be linked as a standard metablock, because the required physical block in plane 2 is bad. In this case, a re-linked metablock is created by substituting a spare physical block in plane 2. A spare physical block being re-linked in place of a bad physical block is preferably located in the same plane as the bad block to maintain programming parallelism within the metablock.

In a preferred embodiment, it is preferable to re-link blocks only within the same die or chip, as a re-linking running across to another die or chip may trigger additional die/chip reads or programs. For example, in an exemplary case of a 4-plane meta-block, where the meta-block spans over 2 chips with 2 planes each, the data can be programmed to (or read from) all 4 planes, which requires 2 chip read/program in parallel. (This may not be 100% parallel but pipelined, so that the page read, block program and erase can be done in parallel, but the data bus being shared so that data transfers are not parallel). In this case, if a metablock is re-linked so that a physical block is taken from another, third chip, than it may be not possible to access it concurrently with the other two and the operation time can double.

If a bad physical block in plane 0 is substituted by a spare block from plane 0, the metablock number is defined by that of the spare block, as shown for metablock n+1 in FIG. 20. Re-linked metablocks may be further re-linked in the event of subsequent physical block failure. Metablocks close to the top of the address space, which cannot be linked as standard metablocks, can take the form of re-linked metablocks.

Figure 21:
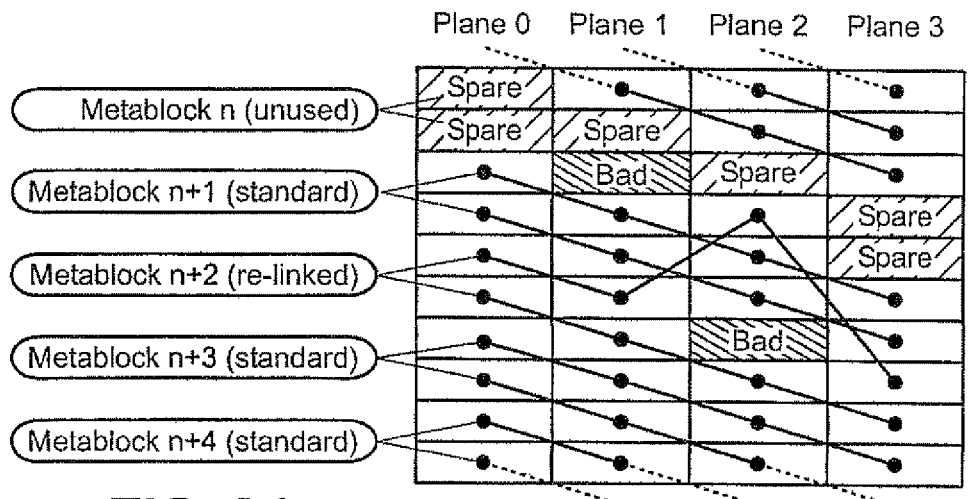
FIG. 21 shows an example of re-linking in the two-dimensional case.

As noted above with respect to FIG. 4d, there are also configurations using two dimensional meta-blocks that link block not only across planes and chips, but also in depth within a given plane. FIG. 21 shows an example of re-linking in the two-dimensional case. In FIG. 21, the '2-D metablock' is example of a 2*4 metablock. The maximum benefit in performance can be achieved when all 8 blocks can be accessed in parallel. The main linking and re-linking principles of 1-D linking methods also apply, but with some extensions. As can be seen in the figure, a bad physical block in any of the physical blocks within a plane lead to a metablock being unused; as is shown for Metablock n. When a 2-D metablock is re-linked, as for the upper block of Metablock n+2 in plane 2, only the bad physical block in a given plane needs to be replaced; for example, for the upper block of Metablock n+2 in plane 2 is re-linked while the lower block of Metablock n+2 in plane 2 is not.

In the embodiment where only the deviations from the standard linking are maintained in a record in the non-volatile memory, the management data structures for metablock linking can be contained within two types of sectors in one or more dedicated block linkage management blocks in flash memory. This arrangement has the advantage, with respect to saving the complete linking, of requiring the storage of less information. Metablock numbers of every re-linked meta-block in the memory system are contained in a link table in a set of link table sectors. No entries for standard metablocks need be stored in the link table, because their physical block addresses are generated deterministically from the metablock number. An RF (re-linked) flag can be used as an attribute of a meta-block, indicating whether the block is standard, and all the blocks are linked in a standard fashion, or whether it is re-linked and requires additional block address translation through the link table (LT). The RF flag can be determined by analyzing the LT and then stored in SRAM, or else stored in a control data structure in the main non-volatile memory as an attribute for the meta-block. Alternately, a list of re-linked sectors can be keep in a list that can be searched through to determine which meta-blocks are re-linked. Entries in the link table can be ordered by metablock number, and each entry has fields for metablock number and block address of each linked physical block.

In an extension of the link table structure, the deviations from the basic algorithm establishing the standard linking can themselves be based on a set of rules; for example, the non-standard linking could be limited to a single plane or limiting how far from its original row a block can be re-linked. Only when the re-linking is an exception to all of the algorithms need it be explicitly kept in the non-volatile memory.

Figure 22:
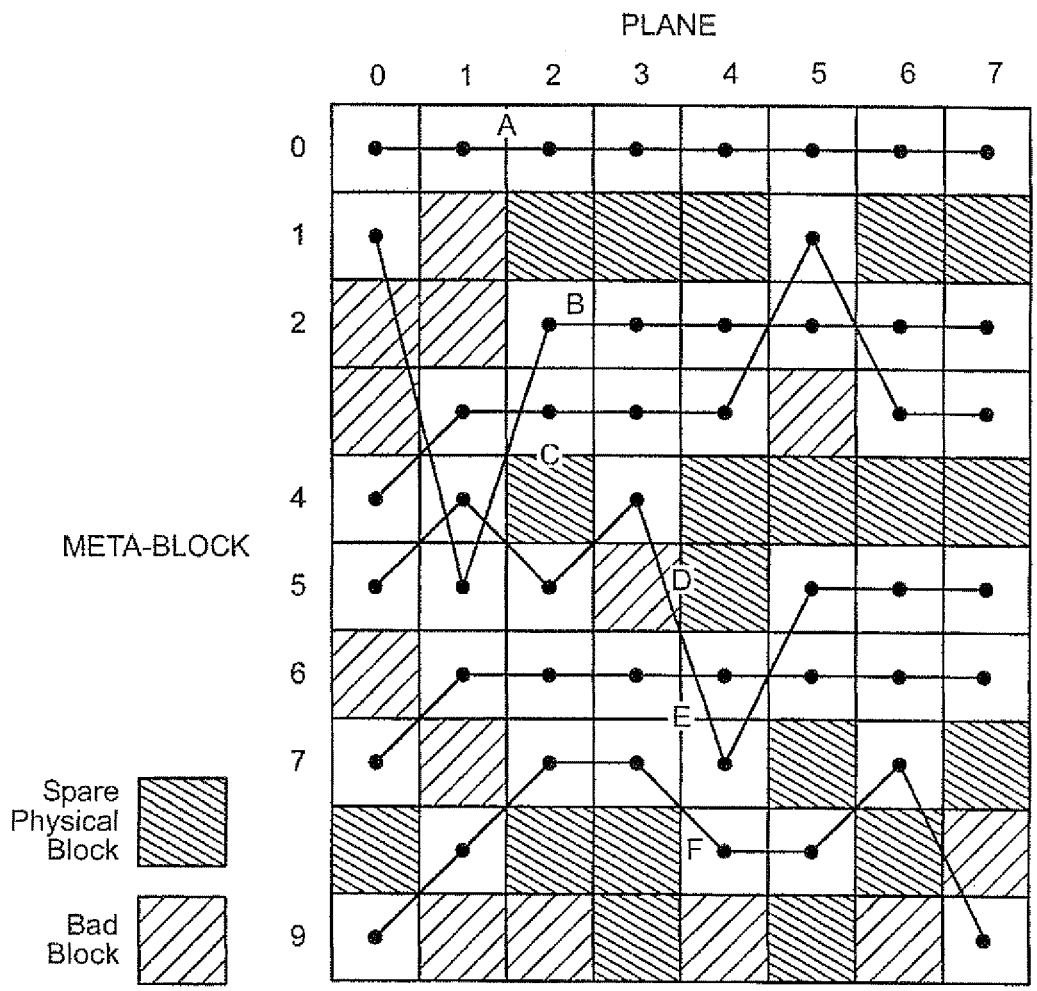

A particular example of a link table and how the information it contains can be compressed is described with respect to FIG. 22 and Table 1. The Link Table sector holds information about blocks that have been re-linked within the card. Depending upon the size of the card and the number of bad blocks within each die, it is possible that there will be more than one Link Table sector present, which can be stored in the Boot Block block. As described above, meta-blocks have a standard method for linking and if one of the blocks is bad, then the meta-block may be able to be re-linked with a spare physical block in the same plane. The Link Tables sectors store the information about which blocks are used in the re-linking. FIG. 22 is another example of the re-linking of meta-blocks.

Of the metablocks shown in FIG. 22, only metablock 0 has the standard linking, here taken as straight across the eight planes. The figure shows several block linking situations:
  A. Metablock 0 is a standard metablock with no re-linking and would therefore not appear in a Link Table sector
  B. Metablock 2 has 2 bad blocks in planes 0* and 1
  C. Metablock 3 has 2 bad blocks in planes 0* and 5
  D. Metablock 5 has 3 bad blocks in planes 1, 3, and 4
  E. Metablock 6 has 1 bad block in plane 0*
  F. Metablock 9 has been completely re-linked from existing spare physical blocks, although the blocks in planes 0 and 7 come from the original meta-block In the cases marked * where the re-linking is due to a bad block in plane 0. In this case, the physical address refers to the location where the original metablock existed. Due to the large number of bad blocks in the example of FIG. 22, there are no metablocks 1, 4, 7, or 8.

The compression algorithm used for block re-linking shown in FIG. 22 can be defined as in Table 1.

TABLE 1

| Meta-block in Diagram | Meta-block number | Number of re-linked items in entry | Repeated values to match number of items | | Total bytes in entry |
|---|---|---|---|---|---|
| | | | Plane | Physical address | |
| | 2 bytes | 1 byte | 1 byte | 2 bytes | |
| 1 | 0x0001 | 0x02 | 0x00 | 0x0002 | |
| | | | 0x01 | 0x0005 | 9 |
| 4 | 0x0004 | 0x02 | 0x00 | 0x0003 | |
| | | | 0x05 | 0x0001 | 9 |
| 5 | 0x0005 | 0x03 | 0x01 | 0x0004 | |
| | | | 0x03 | 0x0004 | |
| | | | 0x04 | 0x0007 | 12 |
| 7 | 0x0007 | 0x01 | 0x00 | 0x0006 | 6 |
| 9 | 0x0009 | 0x06 | 0x01 | 0x0008 | |
| | | | 0x02 | 0x0007 | |
| | | | 0x03 | 0x0007 | |
| | | | 0x04 | 0x0008 | |
| | | | 0x05 | 0x0008 | |
| | | | 0x06 | 0x0007 | 21 |

The size of any link table entry can be defined as:

Number of bytes=3+(3*number of re-linked blocks)

For example, for metablock 1, the first three bytes identify metablock 1 and that it has two re-linkings, with three bytes being allotted to specify each of these re-linkings. The re-linkings are specified by which of the eight planes the re-linked block corresponds (1 byte) and the row number to which that it has been re-linked.

The full set of entries in the link table may be spread across multiple link table sectors. A link table sector is created or modified by writing it to the next available sector position in the block linkage management block. Multiple copies of a link table sector may therefore exist, with only the latest version being valid. An index to the positions of valid link table sectors in the block linkage management block can be contained in a field in the spare physical block list sector in the block linkage management block, which is described below. The metablock number relating to the first entry in each valid link table sector can be held in a list in controller RAM, to allow easy identification of the relevant link table sector for any metablock number. If an additional entry must be added to a link table sector which already contains the maximum number of entries, the sector is split into two new sectors, each with half the entries, and the new entry is inserted in the appropriate new sector.

The block addresses of all spare physical blocks are held as entries in an unordered list in the spare physical block list sector. In some embodiments, it may be convenient to limit the maximum number of spare blocks per plane per chip. In an exemplary embodiment, this is limited to 16, as in most cases this should be large enough. If there are more than 16 spare blocks in a plane, they will be "lost".

Blocks that become spare, because either a standard metablock cannot be created during initial configuration of the flash memory into metablocks or because a physical block linked into a standard or re-linked metablock has failed, are added as new entries to the end of the spare physical block list. When a spare block is required for creation of a re-linked metablock, the first block in the relevant plane closest to the beginning of the spare physical block list can be used. The spare physical block list sector also contains a field with an index to valid link table sector locations.

When a metablock re-link operation takes place and link table sectors are created or modified, the spare physical block list and link table sector index fields can both be modified in the spare physical block list sector. A valid spare physical block list sector is therefore the last written sector in the block linkage management block. When the block linkage management block is full, it can be compacted during a control write operation by rewriting all valid sectors to a new block location, and the full block can be subsequently erased.

To simplify the saving of spare physical block sectors and limit the amount of searching that is required when looking for a replacement block the spare physical block list can be stored by chip, die, and plane. The actual number of sectors required depends on the size of memory device, number of devices, and the interleaving method used. As noted above, it may be convenient to store only a certain number of physical blocks per plane. The number held will depend upon the expected failure rate of blocks and the number of blocks per plane. This means that each spare physical block list sector will hold the spare physical blocks for several planes. The firmware will calculate the correct sector to load and then index into the sector to load the correct values.

When the number of spare physical block lists changes due to re-linking or another bad block being found, a new spare physical block list sector will be written. This may mean two spare physical block list sectors covering the same physical area. The Boot Sector holds the spare physical block list Indices containing the index of the valid sector. If no spare physical blocks exist in an area covered by a spare physical block list, then the sector will not exist in the Boot Block.

Referring back to FIG. 22, this refers to an 8 way interleaved card. There will therefore have to be at least 8 arrays to hold all the spare physical block list information. For every subsequent die on the card there will be an additional 8 arrays required. The spare physical block list corresponding to FIG. 22 is shown in Table 2.

TABLE 2

| Plane | | | |
|---|---|---|---|
| 0 | 0x08 | | |
| 1 | | | |
| 2 | 0x01 | 0x04 | 0x08 |
| 3 | 0x01 | 0x08 | 0x09 |
| 4 | 0x01 | 0x04 | 0x05 |
| 5 | 0x04 | 0x07 | 0x09 |
| 6 | 0x01 | 0x04 | 0x08 |
| 7 | 0x01 | 0x04 | 0x07 |

As with the linking table, the spare physical block list can be stored as a table in non-volatile memory which can be cached into volatile RAM upon demand.

Although the various aspects of the present invention have been described in terms of a firmware based implementation, they may also be implemented in a hardware based implementation. A hardware engine on the controller or, preferably, on a memory chip itself can do the re-linking. The re-linking information can be stored on the chip itself at a special memory location. The controller can then treat all the blocks as standard, and the engine will translate the block addresses to the true internal addresses. The memory will appear to the host (or controller) as a memory with only standard blocks, or as a memory with large physical blocks, without having to know about either the smaller block strictures or the details of any re-linking.

Although specific examples of various aspects of the present invention have been described, it is understood that the present invention is entitled to protection within the scope of the appended claims.

It is claimed:

1. A method of operating a non-volatile memory system having an array of memory storage elements organized in at least two planes, wherein the individual planes are divided into a plurality of non-overlapping blocks of storage elements wherein a block contains the smallest group of memory storage elements that are erasable together, and the individual blocks are divided into a plurality of pages of storage elements wherein a page is the smallest group of memory storage elements that are programmable together, comprising:

linking at least one block from individual ones of said at least two planes to form a metablock wherein the metablock components are erased together as a unit;

redirecting a metablock component block associated with a defective physical block to a spare physical block in the same plane if a spare physical block is available in the same plane;

assigning the metablock components not associated with the defective physical block to a spare block area if no spare physical block is available in the same plane;

updating a defect map structure, wherein the defect map structure includes an entry corresponding to the metablock;

storing a record of said metablock linking in the non-volatile memory; and establishing a set of metablock linkings, each comprised of a plurality of blocks, by which the controller accesses the non-volatile memory, wherein said record is a complete specification of the set of linkings in terms of blocks.

2. A method according to claim 1, wherein said spare physical block is selected from a list of unlinked blocks.

3. A method according to claim 2, wherein said list of unlinked blocks is maintained in the non-volatile memory.

4. A method according to claim 3, further comprising;
subsequent to said replacing the defective block with another one of said blocks, updating said list of unlinked blocks.

5. A method according to claim 1, wherein said spare physical block is selected from blocks formerly belonging to another linking.

6. A method according to claim 1, further comprising:
maintaining a list of unlinked blocks;
determining that one or more blocks in a first of said metablock linkings is defective; and
adding the non-defective blocks in the first metablock to the list of unlinked blocks.

7. A method according to claim 1, further comprising:
determining that a block in a first of said metablock linkings is defective; determining whether an alternate block is available for the defective block; and
in response to determining that an alternate block is not available, removing the first metablock from the set of metablock linkings.

8. A method according to claim 1, wherein said non-volatile memory comprises a plurality of quasi-independent arrays and each of the plurality of blocks in a given one of said metablock linkings are from a different one of said quasi-independent arrays.

9. A method according to claim 8, wherein said quasi-independent arrays are on separate chips.

10. A method according to claim 1, wherein said non-volatile memory comprises a plurality of quasi-independent arrays and the plurality of blocks in a given one of said metablock linkings are comprised of pairs of blocks from the same quasi-independent array, wherein each of the pairs are from a different one of said quasi-independent arrays.

11. A method according to claim 10, wherein said quasi-independent arrays are on separate chips.

12. A method according to claim 1, wherein said record of said metablock linking is stored in a portion of the non-volatile memory other than those assigned for user data.

13. A method according to claim 1, wherein each of said blocks is comprised of a plurality of sectors and each of the sectors includes a data area and an overhead area, and wherein the record information for those blocks containing data is maintained in their overhead area.

14. A method according to claim 13, wherein the record information for those blocks without data is maintained in a portion of the non-volatile memory other than those assigned for user data.

15. A method according to claim 1, wherein establishing a set of linkings comprises forming the metablock linkings according to an algorithm.

16. A method of operating a non-volatile memory system having an array of memory storage elements organized in at least two planes, wherein the individual planes are divided into a plurality of non-overlapping blocks of storage elements wherein a block contains the smallest group of memory storage elements that are erasable together, and the individual blocks are divided into a plurality of pages of storage elements wherein a page is the smallest group of memory storage elements that are programmable together, comprising:
linking at least one block from individual ones of said at least two planes to form a metablock wherein the metablock components are erased together as a unit;
redirecting a metablock component block associated with a defective physical block to a spare physical block in the same plane if a spare physical block is available in the same plane;
assigning the metablock components not associated with the defective physical block to a spare block area if no spare physical block is available in the same plane;
updating a defect map structure, wherein the defect map structure includes an entry corresponding to the metablock;
storing a record of said metablock linking in the non-volatile memory; and
establishing a set of metablock linkings, each comprised of a plurality of blocks, by which the controller accesses the non-volatile memory; wherein said set of linkings is formed according to a rule or an algorithm and the record consists of those linkings that are exceptions to the rule.

17. A method according to claim 16, wherein said spare physical block is selected from a list of unlinked blocks.

18. A method according to claim 17, wherein said list of unlinked blocks is maintained in the non-volatile memory.

19. A method according to claim 18, further comprising;
subsequent to said replacing the defective block with another one of said blocks, updating said list of unlinked blocks.

20. A method according to claim 16, wherein said spare physical block is selected from blocks formerly belonging to another linking.

21. A method according to claim 16, further comprising:
maintaining a list of unlinked blocks;
determining that one or more blocks in a first of said metablock linkings is defective; and
adding the non-defective blocks in the first metablock to the list of unlinked blocks.

22. A method according to claim 16, further comprising:
determining that a block in a first of said metablock linkings is defective; determining whether an alternate block is available for the defective block; and
in response to determining that an alternate block is not available, removing the first metablock from the set of metablock linkings.

23. A method according to claim 16, wherein said non-volatile memory comprises a plurality of quasi-independent arrays and each of the plurality of blocks in a given one of said metablock linkings are from a different one of said quasi-independent arrays.

24. A method according to claim 23, wherein said quasi-independent arrays are on separate chips.

25. A method according to claim 16, wherein said non-volatile memory comprises a plurality of quasi-independent arrays and the plurality of blocks in a given one of said metablock linkings are comprised of pairs of blocks from the same quasi-independent array, wherein each of the pairs are from a different one of said quasi-independent arrays.

26. A method according to claim 25, wherein said quasi-independent arrays are on separate chips.

27. A method according to claim 16, wherein establishing a set of linkings comprises forming the metablock linkings according to an algorithm.

28. A method according to claim 16, wherein said record of said metablock linking is stored in a portion of the non-volatile memory other than those assigned for user data.

29. A method according to claim 16, wherein each of said blocks is comprised of a plurality of sectors and each of the sectors includes a data area and an overhead area, and wherein the record information for those blocks containing data is maintained in their overhead area.

30. A method according to claim 29, wherein the record information for those blocks without data is maintained in a portion of the non-volatile memory other than those assigned for user data.

* * * * *